United States Patent
Gupta et al.

(10) Patent No.: US 12,422,482 B2
(45) Date of Patent: Sep. 23, 2025

(54) APPARATUSES AND METHODS FOR FACILIATATING A DYNAMIC CLOCK FREQUENCY FOR AT-SPEED TESTING

(71) Applicant: NXP B.V., Eindhoven (NL)

(72) Inventors: Chandan Gupta, Greater Noida (IN); Satish Chandra Tiwari, Noida (IN); Abhishek Ashok Bajpaee, Vadodara (IN)

(73) Assignee: NXP B.V., Eindhoven (NL)

( * ) Notice: Subject to any disclaimer, the term of this patent is extended or adjusted under 35 U.S.C. 154(b) by 43 days.

(21) Appl. No.: 18/499,743

(22) Filed: Nov. 1, 2023

(65) Prior Publication Data

US 2025/0085344 A1  Mar. 13, 2025

(30) Foreign Application Priority Data

Sep. 12, 2023 (IN) .............................. 202341061147

(51) Int. Cl.
  *G01R 31/3185* (2006.01)
  *G01R 31/317* (2006.01)
  *G01R 31/319* (2006.01)

(52) U.S. Cl.
  CPC ................ *G01R 31/318552* (2013.01); *G01R 31/31727* (2013.01); *G01R 31/31922* (2013.01)

(58) Field of Classification Search
  CPC ...... G01R 31/318552; G01R 31/31727; G01R 31/31922
  See application file for complete search history.

(56) References Cited

U.S. PATENT DOCUMENTS

| | | | |
|---|---|---|---|
| 2008/0282110 A1 | 11/2008 | Guettaf | |
| 2009/0125771 A1* | 5/2009 | Duggal | G01R 31/318594 326/16 |
| 2011/0276849 A1 | 11/2011 | Periasamy et al. | |
| 2012/0124423 A1 | 5/2012 | Chakravadhanula et al. | |
| 2014/0164860 A1 | 6/2014 | Kim | |
| 2015/0204945 A1 | 7/2015 | Sanghani et al. | |
| 2015/0377960 A1* | 12/2015 | Vahidsafa | G01R 31/318594 714/728 |
| 2016/0173530 A1* | 6/2016 | Miyake | H04L 63/20 726/3 |
| 2019/0101590 A1 | 4/2019 | Sarda | |
| 2020/0051434 A1* | 2/2020 | Sasaki | H04L 12/4625 |

OTHER PUBLICATIONS

Gupta, et al., "System and Method for Controlling At-Speed Testing of Integrated Circuits", U.S. Appl. No. 18/305,464, filed Apr. 24, 2023, 52 pages.
"Automatic test pattern generation," Wikipedia, Accessed Jul. 3, 2023, 5 pages.

* cited by examiner

*Primary Examiner* — Cynthia Britt

(57) ABSTRACT

Aspects of the subject disclosure may include, for example, monitoring first data to identify a first plurality of test points, analyzing the first plurality of test points to identify the first data as being associated with a first time domain included in a plurality of time domains, wherein respective portions of a device under test (DUT) are operative in accordance with a given time domain included in the plurality of time domains, and based on the analyzing of the first plurality of test points, generating first control signals to cause a first clock signal to be adapted to generate a second clock signal that is different from the first clock signal.

20 Claims, 10 Drawing Sheets

APPARATUSES AND METHODS FOR FACILIATATING A DYNAMIC CLOCK FREQUENCY FOR AT-SPEED TESTING

CROSS-REFERENCE TO RELATED APPLICATIONS

This application claims the priority under 35 U.S.C. § 119 of India patent application No. 202341061147, filed on 12 Sep. 2023, the contents of which are incorporated by reference herein.

FIELD OF THE DISCLOSURE

The subject disclosure relates to apparatuses and methods for facilitating a dynamic clock frequency for at-speed testing.

BACKGROUND

Circuits that are developed are frequently subjected to testing to ensure that the associated design functions for intended uses/purposes. Furthermore, testing is used to identify flaws or defects in manufacturing/fabrication of a given instance of a circuit. In either case, the circuits are referred to as a device under test (DUT) when subjected to such testing.

Automatic Test Pattern Generation (ATPG) is a methodology/technology that is used to enable test equipment to apply patterns or test inputs to a DUT. Many DUTs are operative in accordance with a plurality of clock domains or frequencies. As such, it is the case that a first portion of a DUT may be subjected to (ATPG) testing using a first clock domain/frequency and a second portion of a DUT may be subjected to (ATPG) testing using a second clock domain/frequency that is different from the first clock domain/frequency. While in the foregoing example two clock domains/frequencies were referenced, in actual, practical applications involving a DUT that tens or even hundreds of clock domains/frequencies may be needed or required. The implication of such a large number of clock domains/frequencies is that the logic that is needed to support the number of clock domains/frequencies itself is large. This logic is a penalty in terms of overhead that the logic represents.

BRIEF DESCRIPTION OF THE DRAWINGS

Reference will now be made to the accompanying drawings, which are not necessarily drawn to scale, and wherein.

DETAILED DESCRIPTION

Figure 1A:
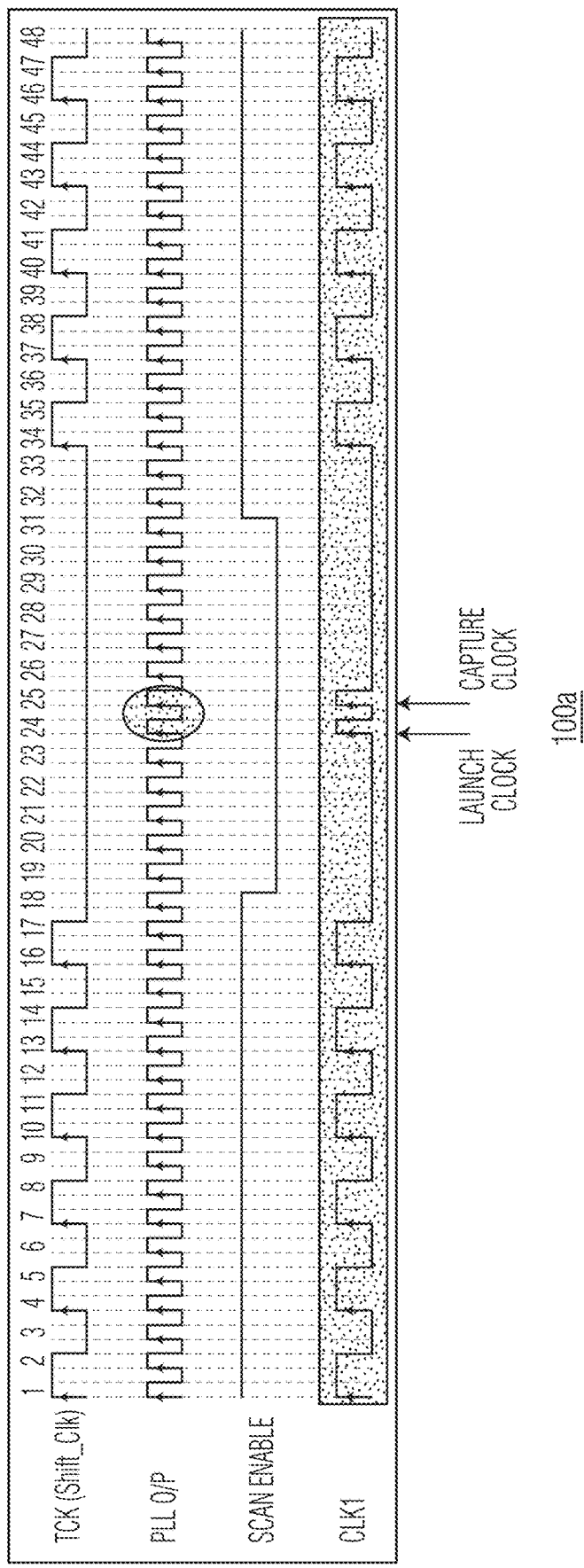
FIGS. 1A-1C are timing diagrams illustrating various signals in accordance with aspects of this disclosure.

The subject disclosure describes, among other things, illustrative embodiments for facilitating a testing of circuits, systems, devices, and the like, generally referred to as a device under test (DUT). The testing may be based on a use of one or more control signals. The control signals may include one or more signals that modify, adapt, or adjust a first clock signal as part of generating a second clock signal. The second clock signal may be selectively applied to portions of the DUT, potentially at one or more instances of time. Other embodiments are described herein.

One or more aspects of the subject disclosure include, in whole or in part, monitoring first data to identify a first plurality of test points; analyzing the first plurality of test points to identify the first data as being associated with a first time domain included in a plurality of time domains, wherein respective portions of a device under test (DUT) are operative in accordance with a given time domain included in the plurality of time domains; and based on the analyzing of the first plurality of test points, generating first control signals to cause a first clock signal to be adapted to generate a second clock signal that is different from the first clock signal.

One or more aspects of the subject disclosure include, in whole or in part, a memory element configured to store a value corresponding to a selected frequency domain included in a plurality of frequency domains, wherein a first portion of a device under test (DUT) is operative in accordance with a first frequency domain included in the plurality of frequency domains and a second portion of the DUT is operative in accordance with a second frequency domain included in the plurality of frequency domains; and a multiplexer that is configured to provide a control signal that causes a first clock signal to be divided to generate a second clock signal, the control signal being based on the value.

One or more aspects of the subject disclosure include, in whole or in part, obtaining, by a processing system including a processor, data; determining, by the processing system, that the data indicates that a clock domain associated with a test of a circuit has changed from a first clock domain to a second clock domain that is different from the first clock domain; and causing, by the processing system and based on the determining, a modification of a first control signal from a first value corresponding to the first clock domain to a second value corresponding to the second clock domain, wherein the first control signal is used to generate a second clock signal from a first clock signal.

As described in further detail below, aspects of this disclosure may enable a simplification of registers that may be used to process signals or data of interest in relation to testing. Furthermore, the sizes/dimensions of such registers may be simplified relative to what exists in the current state of the art. Aspects of this disclosure may facilitate a use of more consistent clock signals, which may enhance stability and reliability in performance. The techniques of this disclosure may lend themselves to a reduction in testing time without any appreciable loss in quality or accuracy.

Figure 1B:
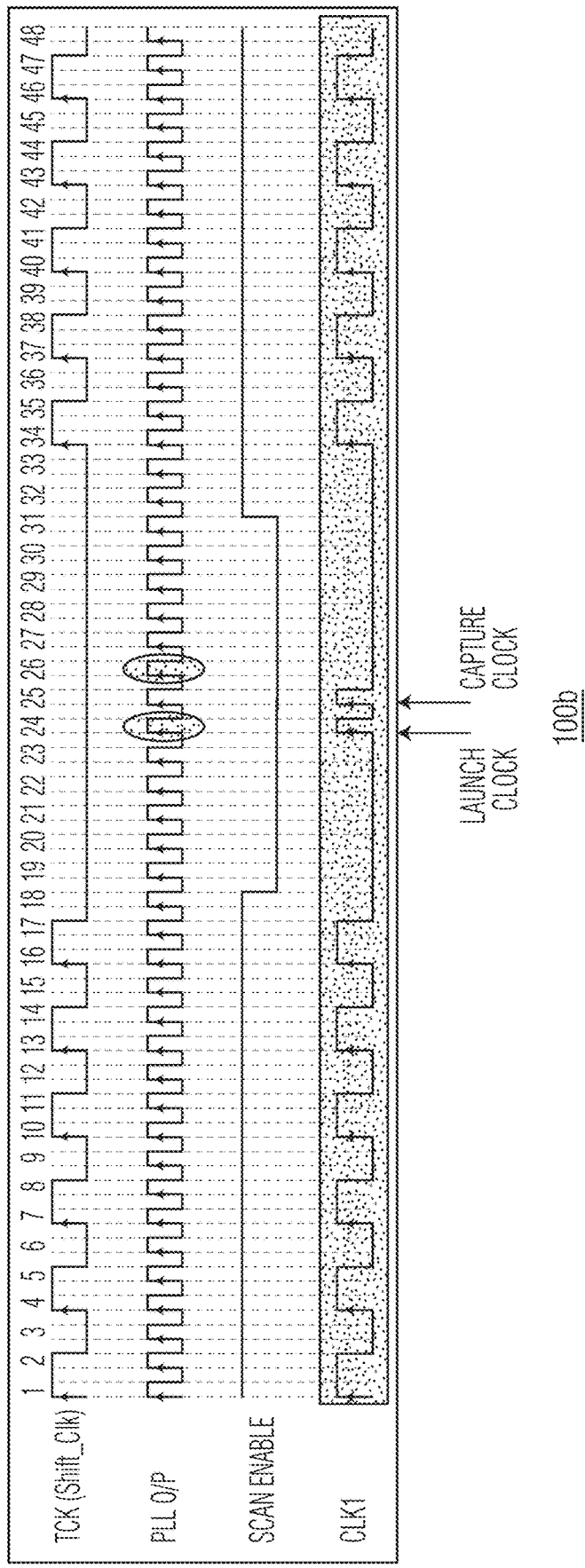
Figure 1C:
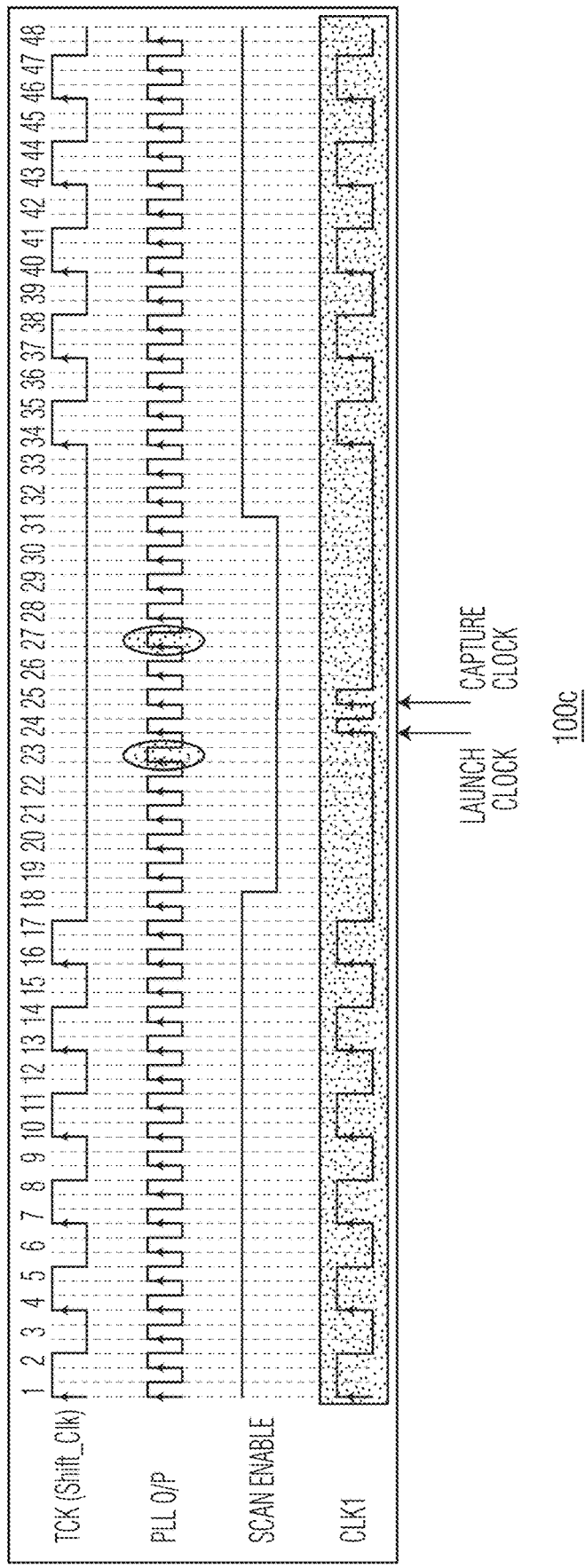

Referring now to FIGS. 1A, 1B, and 1C, sets of waveforms 100a, 100b, and 100c, respectively are shown. Each of the sets 100a, 100b, and 100c may include a Scan Enable signal. When the Scan Enable signal is high (e.g., is equal to '1'), that may enable a shifting or scanning of test points for a pattern or scan chain in accordance with a shift clock (e.g., TCK or Shift_Clk as shown in FIGS. 1A-1C). When the Scan Enable signal is low (e.g., is equal to '0'), that may coincide with a capture phase for capturing one or more outputs from a device under test (DUT).

The sets of waveforms 100a, 100b, and 100c may include a respective clock signal—e.g., CLK1 in the case of the set 100a, CLK2 in the case of the set 100b, and CLK3 in the case of the set 100c—that is based on a main/primary clock (where the main/primary clock may originate or be sourced by/from a phase-locked loop (PLL)). For example, and as shown in FIG. 1A, it may be the case that the CLK1 signal includes, or is based on, two consecutive pulses of a PLL O/P signal (labeled as Launch Clock and Capture Clock in FIG. 1A). In comparison, in FIG. 1B it may be the case that the CLK2 signal includes, or is based on, two pulses of a PLL O/P signal (labeled as Launch Clock and Capture Clock in FIG. 1B) that are spaced apart from one another by an intermediate pulse of the PLL O/P signal. Similarly, in FIG. 1C is may be the case that the CLK3 signal includes, or is based on, two pulses of a PLL O/P signal (labeled as Launch Clock and Capture Clock in FIG. 1C) that are spaced apart from one another by three intermediate pulses of the PLL O/P signal.

The clock signal CLK1 may be referred to as a div-by-1 clock, the clock signal CLK2 may be referred to as a div-by-2 clock, and the clock signal CLK3 may be referred to as a div-by-4 clock. This nomenclature is used to represent the amount or extent that the PLL O/P signal is divided to obtain the respective clock signal (CLK1, CLK2, CLK3), and in particular, the respective Launch Clock and Capture Clock pulses of each of the respective clock signals. A respective one of the clock signals may be utilized as part of a given clock domain or frequency to facilitate testing a portion of a DUT, as described in further detail below. It should be kept in mind that the use of three clocks (and hence, three clock domains or frequencies) is illustrative. Indeed, as described above, in many practical applications a DUT may require or support any number of clock domains or frequencies—e.g., tens or even hundreds of clock domains or frequencies.

Figure 2A:
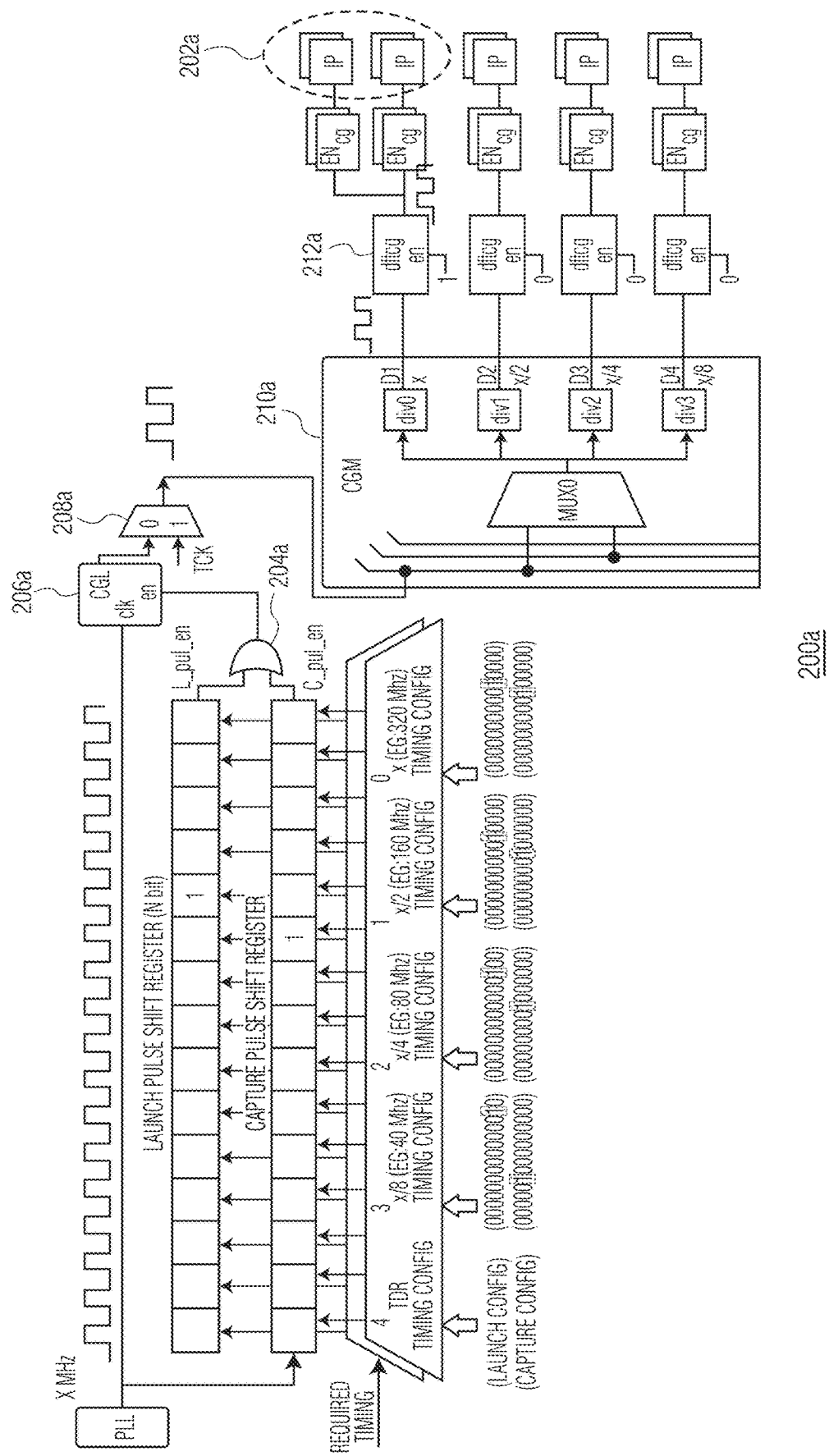
FIGS. 2A-2C are block diagrams of systems for testing portions of a device under test (DUT) in accordance with aspects of this disclosure.

Referring to FIG. 2A, a system 200a is shown that may be operative in accordance with/used to generate the clock signal CLK1 of FIG. 1A. In particular, the system 200a may include a PLL operating at a frequency of 'X' MHz, where 'X' is a number (e.g., 320, such that the operating frequency is 320 MHz). Furthermore, it may be assumed that the DUT in FIG. 2A coincides with the entities labeled 'IP' in FIG. 2A. The portion of the DUT/IPs corresponding to/coinciding with the ellipse 202a superimposed in FIG. 2A may be operative in accordance with the first clock domain/frequency (e.g., CLK1 of FIG. 1A), whereas the other IPs shown in FIG. 2A may correspond to other portions of the DUT that may be operative in accordance with other clock domains/frequencies that are different from the first clock domain/frequency.

To facilitate a generation of CLK1 as part of the system 200a, a Launch Pulse Shift register and a Capture Pulse Shift register are shown. The Launch Pulse Shift register and the Capture Pulse Shift register may be loaded primarily with values of '0', except for the particular locations within each that are identified as having been loaded with a value of '1' in FIG. 2A. The values in the Launch Pulse Shift register and the Capture Pulse Shift register may be shifted (to the right in FIG. 2A) on respective pulses (e.g., respective rising edges) of the PLL. Each of the outputs of the Launch Pulse Shift register and the Capture Pulse Shift register may be coupled to a respective input of an 'OR' gate 204a, and the output of the 'OR' gate 204a may drive an enable (en) input of a clock gating logic (CGL) 206a. The output of the CGL 206a may serve as an input (e.g., a first input) to a multiplexer (MUX) 208a; a second input of the MUX 208a may correspond to the TCK signal (see, e.g., FIG. 1A for an example of the TCK signal).

The output of the MUX 208a may serve as an input to a clock gated management (CGM) 210a that may include one or more multiplexers (e.g., MUX0) that may drive/feed the inputs of one or more clock domains (represented in FIG. 2A as div0, div1, div2, and div3). Since it is assumed that in FIG. 2A the portion 202a of the DUT operates in accordance with the first clock domain (CLK1), the corresponding dftcg 212a may have its enable input set equal to '1' to enable or pass the output of div0 to the IPs associated with the ellipse 202a (or the corresponding, associated cg circuits shown in FIG. 2A), whereas the other dftcg shown in FIG. 2A may have their corresponding enable inputs set equal to '0' to avoid passing the output of the mux 208a (or, analogously, the output of the MUX0) to the associated IPs.

Figure 2B:
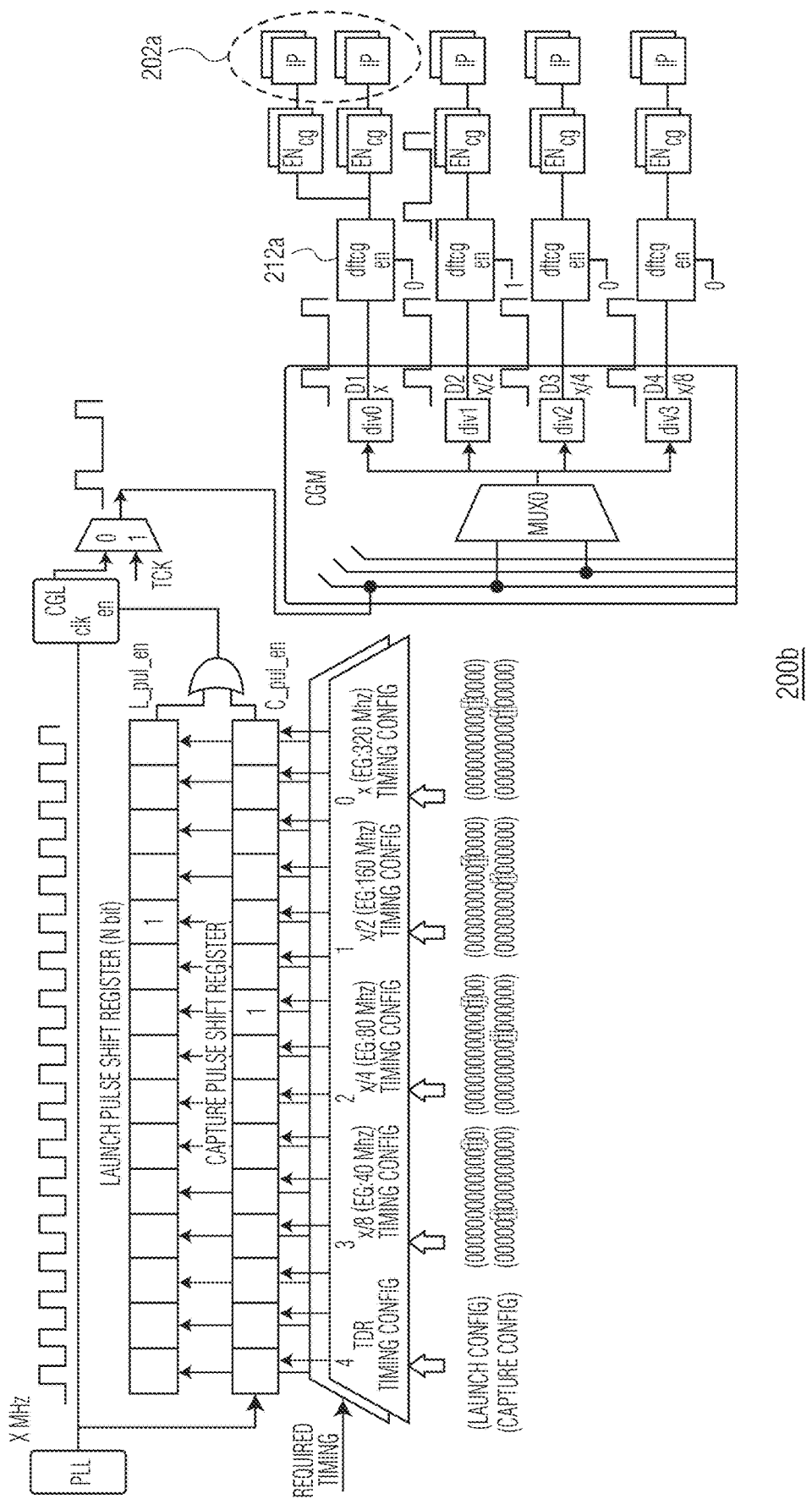

Referring now to FIG. 2B, a system 200b is shown that may be operative in accordance with/used to generate the clock signal CLK2 of FIG. 1B. The system 200b may include many of the same components/devices shown and described above in connection with the system 200a of FIG. 2A, and so, a complete re-description of those components/devices is omitted herein for the sake of brevity. In terms of differences between FIG. 2A and FIG. 2B, in FIG. 2B there may be a gap/space between the 1's that are loaded in the Launch Pulse Shift register and the Capture Pulse shift register. Furthermore, in FIG. 2B the dtfcg 212a enable (en) input may be set equal to '0' to disable testing of the IP 202a, whereas the dtfcg 212b enable (en) input may be set equal to '1' to enable testing of the IP 202b.

Figure 2C:
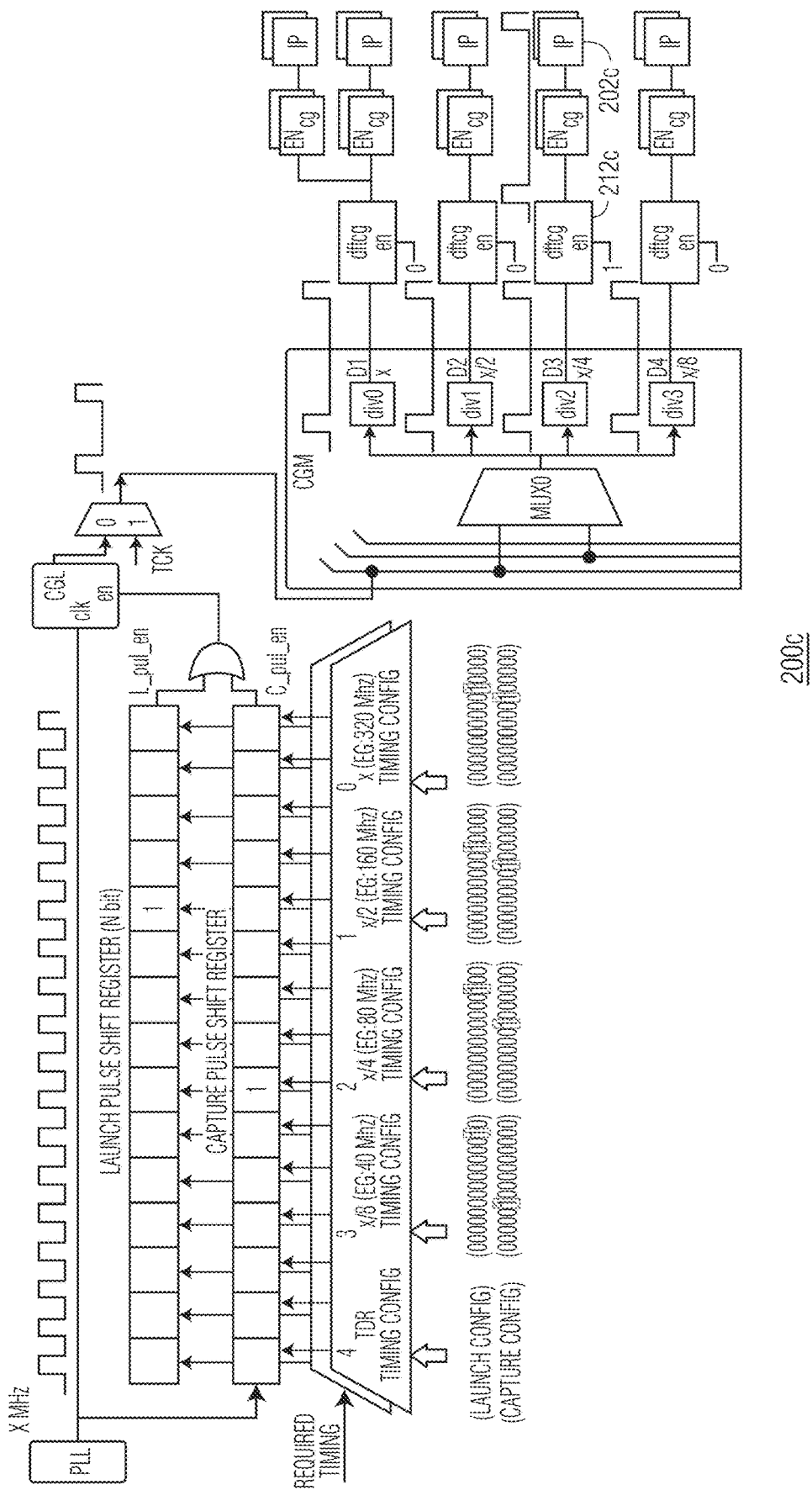

Referring now to FIG. 2C, a system 200c is shown that may be operative in accordance with/used to generate the clock signal CLK3 of FIG. 1C. The system 200c may include many of the same components/devices shown and described above in connection with the system 200a of FIG. 2A (and the system 200b of FIG. 2B), and so, a complete re-description of those components/devices is omitted herein for the sake of brevity. In terms of differences between FIG. 2C and FIG. 2A (and FIG. 2B), in FIG. 2C there may be three gaps/spaces between the 1's that are loaded in the Launch Pulse Shift register and the Capture Pulse shift register. Furthermore, in FIG. 2C the dtfcg 212c enable (en) input may be set equal to '1' to enable testing of the IP 202c; all the enable (en) inputs of the other dtfcg devices/components shown in FIG. 2C may be set equal to '0' to disable testing the other IPs shown in FIG. 2C.

As the foregoing demonstrates, the systems 200a-200c may facilitate testing respective portions (where such portions are fairly represented by the IPs shown in FIGS. 2A-2C) of a DUT that utilizes multiple clock domains or frequencies by adjusting the relative gap/spacing in the values used between the Launch Pulse Shift register and the Capture Pulse Shift register and controlling which dtfcg component(s) is/are enabled or disabled. While such techniques are generally acceptable, aspects of this disclosure may utilize different techniques to facilitate a generation of a clock signal that may be used to test different parts/portions of a DUT as described in further detail below. In this respect, reference may be made to FIG. 3A, which illustrates a system 300a for generating a clock signal (PLL_CLK) in accordance with aspects of this disclosure.

Figure 3A:
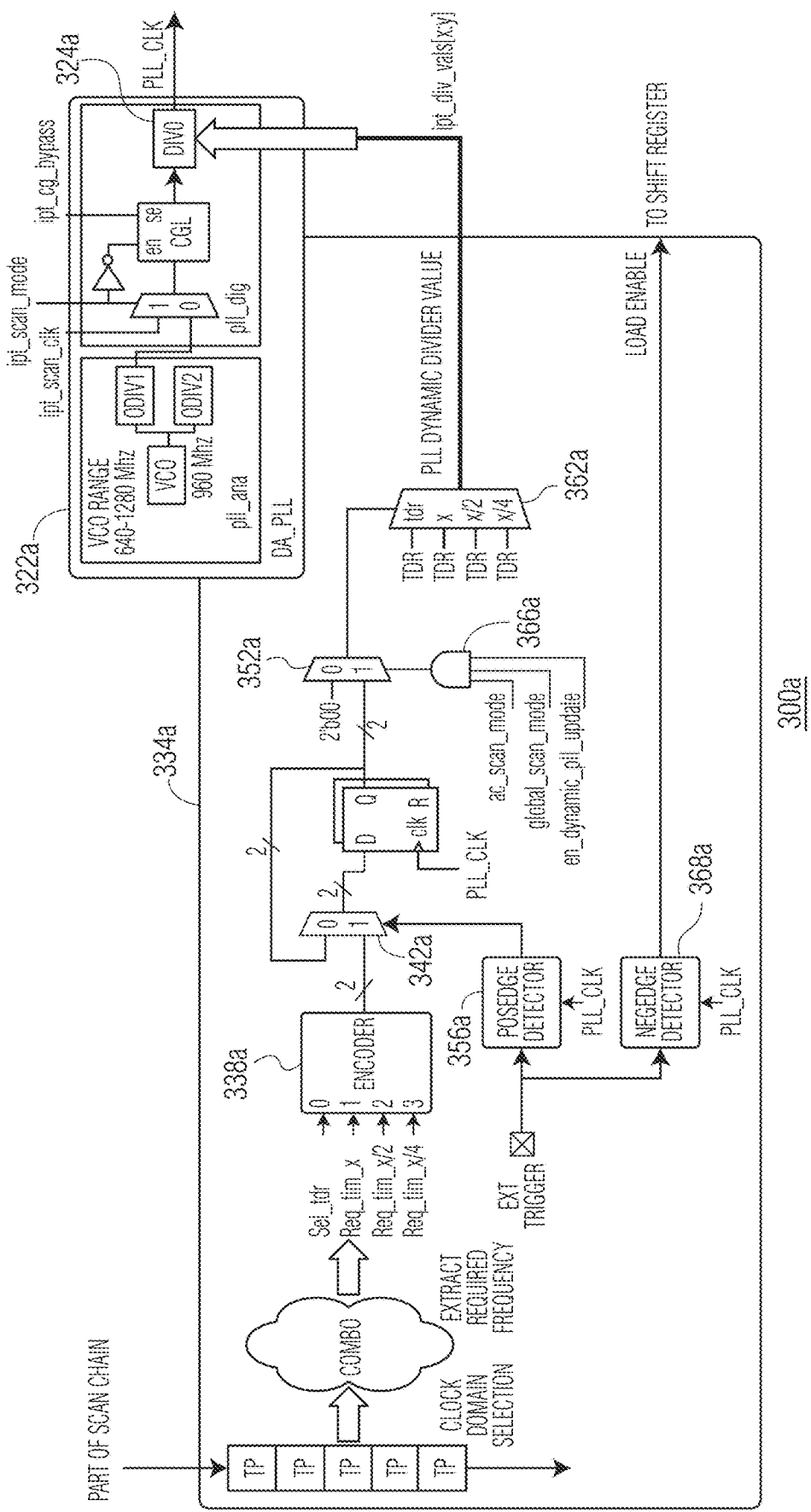
FIG. 3A is a block diagram of a system for generating a second clock signal from a first clock signal in accordance with aspects of this disclosure.

In particular, the system 300a may include a (DA_PLL) circuit 322a that may include an analog portion (pll_ana) and a digital portion (pll_dig) to generate the PLL_CLK signal. Various ones of the components that may be used as part of the DA_PLL circuit 322a as shown in FIG. 3A (such as, for example, a voltage controlled oscillator (VCO)), as well as a use of various ones of the signals (e.g., various ones of the control signals) associated with the circuit 322a, would be known and appreciated by one of skill in the art, and so, a description of the same is omitted herein for the sake of brevity. The DA_PLL circuit 322a may include a divider component/circuit (DIV0 324a in FIG. 3A) that may be driven by a series/set of select lines that are output from a circuit 334a as shown in FIG. 3A. The purpose and use of the divider 324a will become clearer in the description that follows below.

As shown in FIG. 3A, the circuit 334a may include a sequence or series of test points (where each such test point is denoted as TP in FIG. 3A) that may be analyzed through a combination (COMBO) to determine/identify an associated or required clock domain or frequency. In some embodiments, the TPs may be included or incorporated as part of a scan-based technology or approach, such as for example in relation to ATPG based testing. Illustratively, each of the candidate clock domains/frequencies is represented as a respective input to an encoder 338a of the circuit 334a (it is noted that the Sel_tdr input to the encoder 338a may be representative of a default value). The output of the encoder 338a may serve as an input (e.g., a first input) to a MUX 342a; a second input of the MUX 342a may correspond to an output of a memory element (e.g., a set of flip-flops) 346a. The memory element 346a may be driven by the PLL_CLK output of the circuit 322a to synchronize the operations of the circuit 322a and the memory element 346a. The output of the memory element 346a may drive an input (e.g., a first input) of a MUX 352a; the second input of the MUX 352a may correspond to a '0' value as a default.

The value/signal at the EXT TRIGGER pin shown in FIG. 3A may correspond to a time-delayed, sampled version of the Scan Enable signal described above in reference to FIGS. 1A-1C. For example, as the Scan Enable signal transitions from a '1' to a '0' (corresponding to the start of the capture phase referenced above), this may cause the signal at the EXT TRIGGER pin to transition from a '0' to a '1'. The signal at the EXT TRIGGER pin may remain low (e.g., '0') throughout when the Scan Enable signal is high (e.g., '1') and may be driven from low to high (e.g., '0' to '1') when the Scan Enable signal is low (e.g., '0'). The transition from '0' to '1' on the EXT TRIGGER pin may be detected by a positive edge (Posedge) detector 356a that may, for a duration of one (PLL_CLK) cycle, output a value of '1' to enable the output of the encoder 338a to serve as the input to the memory element 346a by way of the MUX 342a. In this respect, the time domain/frequency represented by the output of the encoder 338a may be stored by/at the memory element 346a. In turn, the output of the memory element 346a may selectively be provided to a MUX 362a by way of the MUX 352a and corresponding control/select logic 366a (where, illustratively, the control/select logic 366a is shown as an 'AND' gate in FIG. 3A; the inputs to the control/select logic 366a may be selected/adapted to satisfy any requirements associated with the particular test environment that may be at hand). The output of the MUX 362a may correspond to the series/set of select lines described above in relation to the circuit 322a.

After an amount of time has been allowed to elapse following the transition of the signal at the EXT TRIGGER pin from '0' to '1' (where the amount of time is selected to allow the divider DIV0 324a of the circuit 322a to settle/stabilize), the signal at the EXT TRIGGER pin may be caused to transition from '1' to '0'. This transition from '1' to '0' in the signal at the EXT TRIGGER pin may be detected by a negative edge (negedge) detector 368a (where the negedge detector 368a may also be synchronized to the PLL_CLK). In turn, the negedge detector 368a may, for a duration of one (PLL_CLK) cycle, output a value of '1' to enable shift registers (see, e.g., Launch Pulse Shift register and Capture Pulse Shift register shown in FIG. 3C) to extract the associated launch and capture clock pulses of the type shown in FIGS. 1A-1C.

Figure 3B:
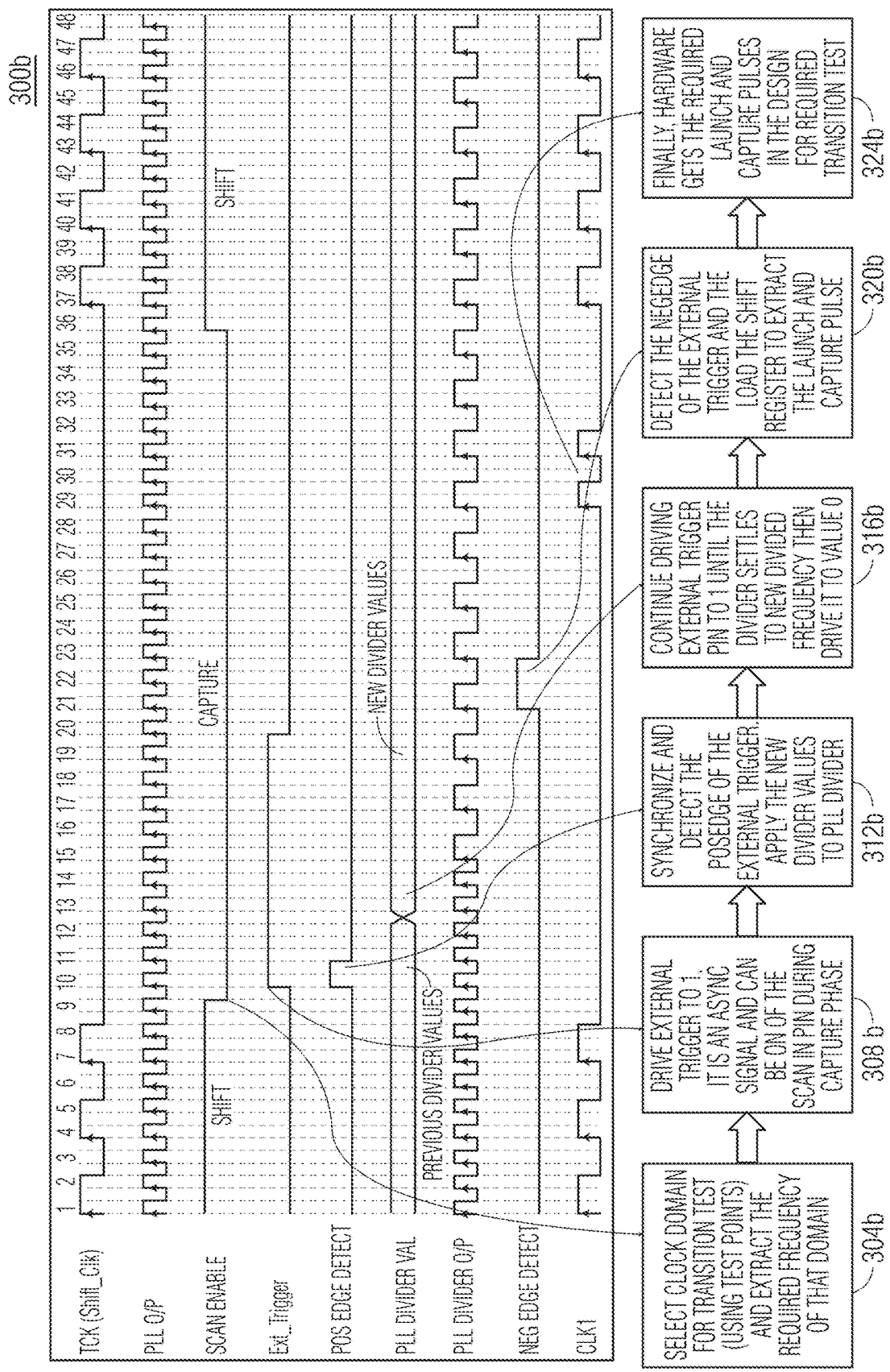
FIG. 3B depicts a timing diagram, and associated method, in accordance with aspects of this disclosure.

Reference may also be made to FIG. 3B, which depicts a timing diagram 300b associated with operations within the system 300a. In particular, in FIG. 3B the signal PLL O/P corresponds to the pre-divided output of the circuit 322a (e.g., the input to the component DIV0 324a), the signal PLL Divider O/P corresponds to the output PLL_CLK of the circuit 322a, the Ext_Trigger signal corresponds to the signal present at the EXT TRIGGER pin of FIG. 3A, the signal Pos Edge Detect corresponds to the output of the Posedge detector 356a, the signal Neg Edge Detect corresponds to the output of the negedge detector 368a, and the signal PLL Divider val corresponds to the output of the MUX 362a; the other signals shown in FIG. 3B (such as TCK, Scan Enable, and CLK1) have been described above in relation to, e.g., FIG. 1A, and are superimposed in FIG. 3B for the sake of reference.

Superimposed within FIG. 3B is a series/sequence of blocks 304b-324b that represent an exemplary method in accordance with various aspects described herein. The blocks of the method may be related to one or more signal edges or events as shown in FIG. 3B. The method may be implemented or executed, in whole or in part, in conjunction with one or more systems, devices, and/or components, such as for example the systems, devices, and components set forth herein. In some embodiments, the method may be executed, in whole or in part, in conjunction with one or more processing systems, where a processing system may include one or more processors. The various operations of the method (represented by the blocks in FIG. 3B) may be embodied as instructions that may be executed by the processing system(s) to facilitate the operations. The instructions may be stored by one or more elements or members, such as a memory or memory device, a computer or machine-readable medium (e.g., a transitory machine-readable medium, a non-transitory machine-readable medium), etc. The operations/blocks of the method are described in further detail below.

In block 304b, test points (TPs) may be monitored. For example, the TPs may be extracted from, e.g., a set—such as a stream of, data or data patterns. As part of block 304b, the TPs may be analyzed. As part of the analysis, a time, clock, or frequency domain may be identified/selected. The analysis of block 304b may be facilitated via a use of machine learning and/or artificial intelligence. In some embodiments, the TPs may be included/incorporated as part of scan chains, where the scan chains may provide a mechanism that can directly program or control the values that are utilized for the TPs. ATPG techniques may be used as part of the scan chains.

In block 308b, a trigger signal (e.g., the Ext_Trigger signal) may be asserted/activated to facilitate conveying the time, clock, or frequency domain selection (identified as part of block 304b) to, e.g., a memory element (see, e.g., FIG. 3A: memory element 346a) as part of block 312b. As part of block 312b, the output of the memory element may supply/provide values to cause a PLL clock signal to be divided in accordance with the selection (see, e.g., FIG. 3A, and in particular, the sequence/chain of logic from the memory element 346a, through the MUX 352a and the MUX 362a to the divider DIV0 324a).

In block 316b, the trigger signal may continue to be asserted for at least an amount of time to allow the output of the divided PLL clock signal (e.g., the output of DIV0 324a) to settle/stabilize. Once that amount of time has elapsed, the trigger signal may be unasserted/deactivated. In some embodiments, the amount of time that is used may be based on one or more inputs, such as one or more user-generated inputs.

In block 320b, the deactivation of the trigger signal (as part of block 316b) may be detected (by, e.g., negedge detector 368a of FIG. 3A), and based on that detection, one or more shift registers may be loaded to extract one or more pulses (e.g., launch and capture pulses). In block 324b, the pulses generated as part of block 320b may be provided to (a portion of) a DUT to facilitate testing or verification activities in respect of the same. For example, as part of block 324b one or more outputs of the DUT may be captured/acquired/stored for analysis.

While for purposes of simplicity of explanation, the respective processes are shown and described as a series of blocks in FIG. 3B, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 3C:
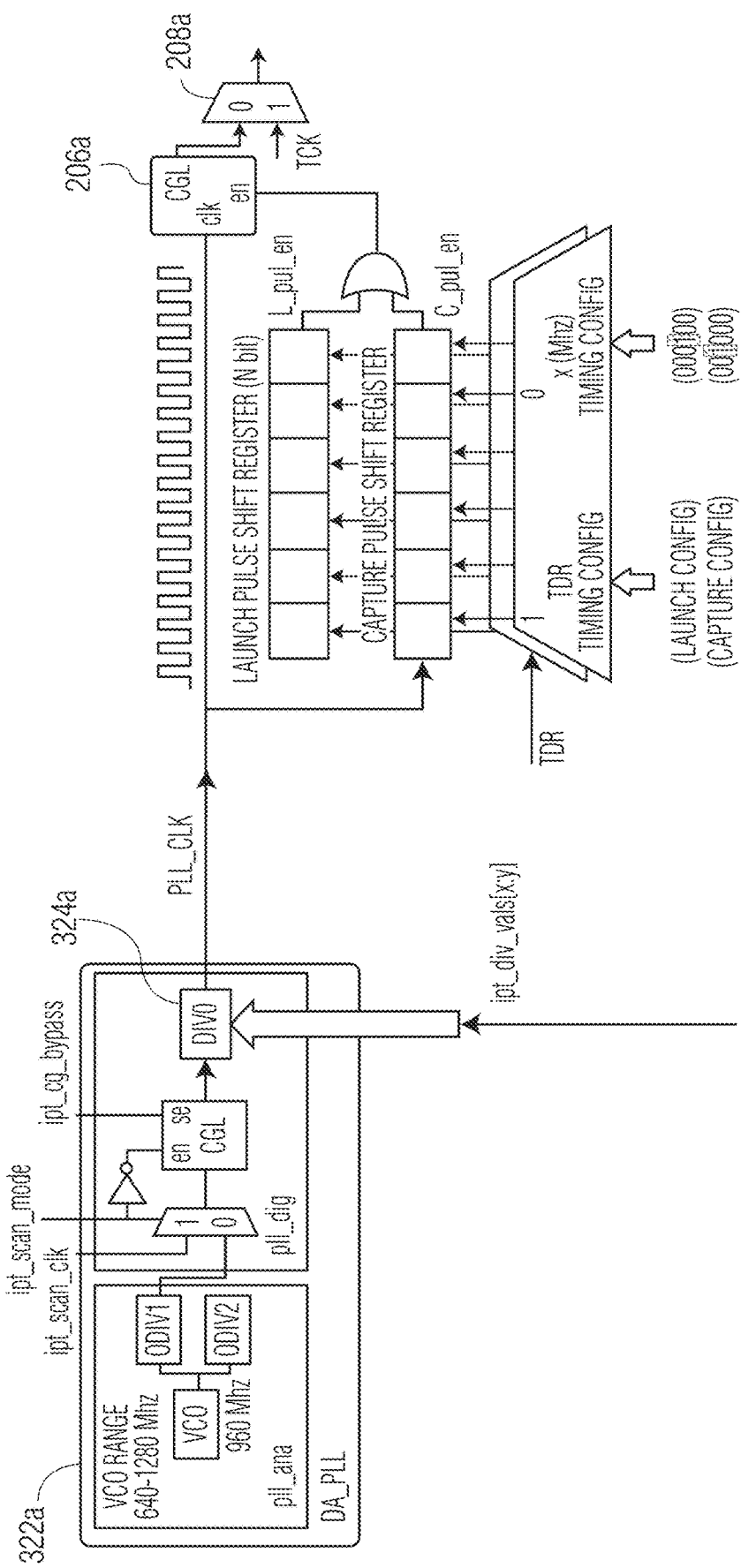
FIG. 3C depicts a system for controlling a capture of one or more outputs of a DUT based on a clock signal in accordance with various aspects of this disclosure.

With reference to FIG. 3C, a system 300c is shown. Aspects of the system 300c may be combined with aspects of the system 300a of FIG. 3A. For example, the system 300c may include the circuit 322a of the system 300a (where the circuit 322a may be driven by/from the circuit 334a as shown in FIG. 3A). Furthermore, the system 300c may include aspects of the systems 200a, 200b, and 200c of FIGS. 2A-2C. For example, the system 300c may include the CGL 206a and the MUX 208a. Additional components/devices of the systems 200a-200c (such as the CGM 210a, the dftcg components, the cg components, and/or the IP components shown in FIGS. 2A-2C) may be included/incorporated as part of the system 300c.

In terms of differences, the nature of the division imposed on the PLL O/P signal (as fairly shown and described above in relation to FIGS. 3A-3B) may simplify the nature and use of the Launch Pulse Shift register and the Capture Pulse Shift register as part of the system 300c. For example, a clock domain or frequency that is of interest may already be present/included in the PLL_CLK signal output of the circuit 322a, such that the Launch Pulse Shift register and the Capture Pulse Shift register can simply be loaded with single instances of adjacent or consecutive values of '1', similar to what is shown in FIG. 2A, irrespective/independent of the clock domain or frequency that is used. Furthermore, the sizes of the Launch Pulse Shift register and the Capture Pulse Shift register may be substantially reduced relative to their counterparts shown in FIGS. 2A-2C. Additionally, the nature of the PLL_CLK signal of FIGS. 3A and 3C may be representative of a consistent, 50% duty cycle clock (plus or minus some threshold amount—e.g., 1%); this may be contrasted with the "punch-through" nature of the clock signals (CLK1, CLK2, CLK3) shown in FIGS. 1A-1C. The time it takes to facilitate DUT verification may be reduced via the use of the system 300c (relative to, e.g., the systems 200a-200c of FIGS. 2A-2C), without any loss in quality or accuracy.

As the foregoing description demonstrates, aspects of this disclosure may represent substantial improvements to technology in relation to practical applications associated with testing and verifying a DUT, including DUTs that are operative in accordance with multiple clock domains or frequencies. In this regard, one of skill in the art will appreciate, based on a review of this disclosure, that the various aspects of this disclosure are not directed to abstract ideas. To the contrary, the various aspects of this disclosure are directed to, and encompass, significantly more than any abstract idea standing alone.

Figure 4:
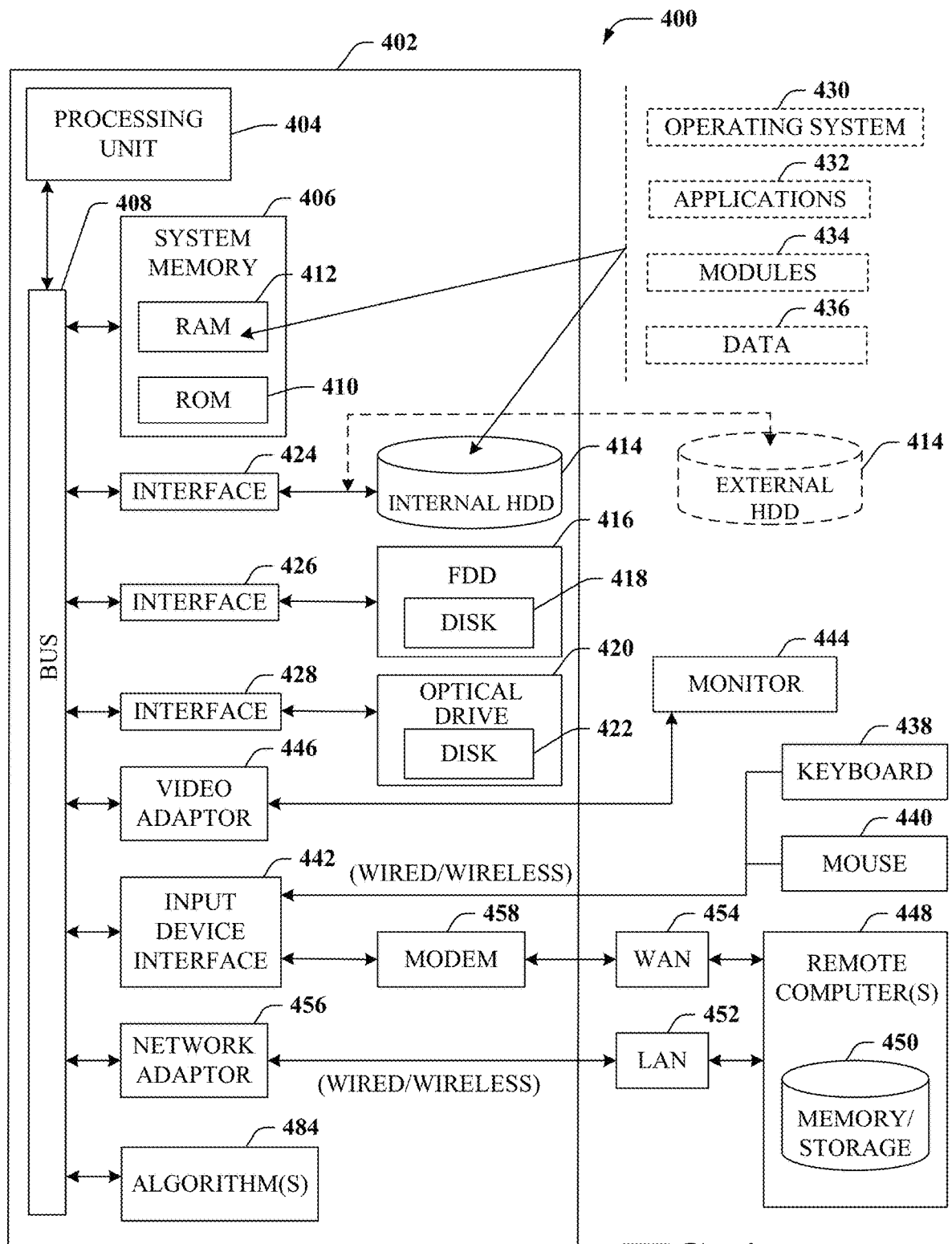
FIG. 4 depicts a computing environment in accordance with aspects of this disclosure.

Turning now to FIG. 4, there is illustrated a block diagram of a computing environment 400 in accordance with various aspects described herein. In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of the method of FIG. 3B, where the method may be executed/implemented to obtain a verification or analysis of a DUT (or one or more respective portions thereof). Aspects of the components/devices shown in FIG. 4 can be implemented via computer-executable instructions that can run on one or more computers, and/or in combination with other program modules and/or as a combination of hardware and software.

Generally, program modules comprise routines, programs, components, data structures, etc., that perform particular tasks or implement particular data types. Moreover, those skilled in the art will appreciate that the methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The exemplary embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment 400 can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communication network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

In operation, the computing environment 400 may include or provide a processing system for an engineer, a designer, a technician, or the like (generally referred to herein as a user) to effectuate aspects of this disclosure as set forth herein. For example, the computing environment 400 may provide an interface (such as, for example, via the keyboard 438 or the mouse 440) to enter parameters or values pertaining to an application, a function, a service, or the like, and the computing environment 400 may generate and produce one or more outputs pertaining to circuit or system topologies that implement power and material/area savings in accordance with the various aspects of this disclosure. In FIG. 4, the methodologies or procedures, such as the type shown via the blocks in FIG. 3B, may be represented by algorithm(s) 484. The algorithm(s) 484 may be executed by, e.g., the processing unit 404, to effectuate one or more of the operations or methodological acts described herein. While shown separately, it will be understood and appreciated by one of skill in the art that the algorithm(s) 484 may be included or embodied as part of one or more entities, such as the memory 406, the disk 418 or the disk 422, the external HDD 414, the memory storage 450, etc.

The terms "first," "second," "third," and so forth, as used in the claims, unless otherwise clear by context, is for clarity only and does not otherwise indicate or imply any order in time. For instance, "a first circuit" and "a second circuit" does not indicate or imply that the first circuit is to be made before the second circuit, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Some of the embodiments described herein can also employ artificial intelligence (AI) or machine learning (ML). AI and/or ML may facilitate automating one or more features described herein.

As used in some contexts in this application, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the term "user" can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Where applicable, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, where a particular flow diagram indicates a particular ordering of steps, other orderings are likewise possible provided that the principles of causality are maintained.

As may also be used herein, the term(s) "operably coupled to", "coupled to", "coupling", and the like include direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

We claim:

1. A device, comprising:
   a processing system including a processor; and
   a memory that stores executable instructions that, when executed by the processing system, facilitate performance of operations, the operations comprising:
   monitoring first data of a first plurality of test points;
   analyzing the first data of first plurality of test points to identify a first time domain included in a plurality of time domains, wherein respective portions of a device under test (DUT) are operative in accordance with a given time domain included in the plurality of time domains; and
   based on the analyzing of the first plurality of test points, generating first control signals to cause a first clock signal to be adapted to generate a second clock signal that is different from the first clock signal, wherein the first time domain defines a portion of the device arranged to be tested at a defined time based on a frequency of the second clock signal.

2. The device of claim 1, wherein the first clock signal has a first frequency and the second clock signal has a second frequency that is different from the first frequency.

3. The device of claim 2, wherein the second frequency is less than the first frequency.

4. The device of claim 1, wherein the second clock signal is provided to a first portion of the respective portions of the DUT.

5. The device of claim 4, wherein the second clock signal is prevented from being provided to a remainder of the respective portions of the DUT.

6. The device of claim 1, wherein the operations further comprise:
   subsequent to the generating of the first control signals, monitoring second data to identify a second plurality of test points;
   analyzing the second plurality of test points to identify the second data as being associated with a second time domain included in the plurality of time domains, the second time domain being different from the first time domain; and
   based on the analyzing of the second plurality of test points, generating second control signals to cause the first clock signal to be adapted to generate a third clock signal that is different from the second clock signal.

7. The device of claim 6, wherein the second clock signal is provided to a first portion of the respective portions of the DUT, and wherein the third clock signal is provided to a second portion of the respective portions of the DUT.

8. The device of claim 6, wherein only one of the second clock signal or the third clock signal has a same frequency as the first clock signal.

9. The device of claim 1, wherein the first clock signal is generated via a phase-locked loop (PLL).

10. The device of claim 1, wherein the operations further comprise:
    subsequent to the generating of the first control signals, allowing a threshold amount of time to elapse to enable the second clock signal to stabilize; and
    based on the threshold amount of time having elapsed, loading registers with values that cause at least one output of the DUT to be captured.

11. The device of claim 10, wherein the at least one output includes a plurality of outputs associated with a first portion of the respective portions of the DUT, and wherein the operations further comprise:
    validating the first portion of the DUT based on an analysis of the plurality of outputs.

12. The device of claim 10, wherein the at least one output includes a plurality of outputs associated with a first portion of the respective portions of the DUT, and wherein the operations further comprise:
    identifying a manufacturing defect in the first portion of the DUT based on an analysis of the plurality of outputs.

13. The device of claim 1, wherein the second clock signal has a duty cycle between 49% and 51%, inclusive.

14. A circuit comprising:
    a memory element configured to store a value corresponding to a selected frequency domain included in a plurality of frequency domains, wherein a first portion of a device under test (DUT) is operative in accordance with a first frequency domain included in the plurality of frequency domains and a second portion of the DUT is operative in accordance with a second frequency domain included in the plurality of frequency domains; and
    a multiplexer that is configured to provide at least one control signal that causes a first clock signal to be divided to generate a second clock signal, the at least one control signal being based on the value, wherein the selected frequency domain defines a portion of the device arranged to be tested at a defined frequency of the second clock signal.

15. The circuit of claim 14, wherein at a first point in time the value corresponds to the first frequency domain, and wherein at a second point in time that is different from the first point in time the value corresponds to the second frequency domain.

16. The circuit of claim 14, wherein the memory element includes a clock input that is driven by the second clock signal.

17. The circuit of claim 14, wherein the value is based on a plurality of test points, the plurality of test points being controlled via an Automatic Test Pattern Generation (ATPG) scan chain.

18. The circuit of claim 14, wherein the operations further comprise:
    determining that an amount of time has elapsed from the multiplexer providing the at least one control signal; and
    based on the determining that the amount of time has elapsed, asserting a second at least one control signal that causes an output of the DUT to be captured.

19. A method, comprising:
    obtaining, by a processing system including a processor, data;
    determining, by the processing system, that the data indicates that a clock domain associated with a test of a circuit has changed from a first clock domain to a second clock domain that is different from the first clock domain; and
    causing, by the processing system and based on the determining, a modification of a first control signal from a first value corresponding to the first clock domain to a second value corresponding to the second clock domain, wherein the first control signal is used to generate a second clock signal from a first clock signal, wherein the second clock domain defines a portion of the circuit arranged to be tested at a defined frequency of the second clock signal.

20. The method of claim 19, further comprising:

causing, by the processing system, the second clock signal to be applied to a first portion of the circuit at a first point in time in accordance with a second control signal, wherein the first point in time precedes the obtaining of the data;

preventing, by the processing system, the second clock signal from being applied to a second portion of the circuit at the first point in time in accordance with a third control signal;

causing, by the processing system, the second clock signal to be applied to the second portion of the circuit at a second point in time in accordance with the third control signal, wherein the second point in time is subsequent to the obtaining of the data; and preventing, by the processing system, the second clock signal from being applied to the first portion of the circuit at the second point in time in accordance with the second control signal.

\* \* \* \* \*